US006372559B1

(12) United States Patent
Crowder et al.

(10) Patent No.: US 6,372,559 B1
(45) Date of Patent: Apr. 16, 2002

(54) METHOD FOR SELF-ALIGNED VERTICAL DOUBLE-GATE MOSFET

(75) Inventors: Scott Crowder, Ossining; Michael J. Hargrove, Clinton Corners; Suk Hoon Ku, Beacon, all of NY (US); L. Ronald Logan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/709,073

(22) Filed: Nov. 9, 2000

(51) Int. Cl.$^7$ ................................................. H01L 21/00
(52) U.S. Cl. ..................... 438/157; 438/156; 438/162; 438/166
(58) Field of Search ................................. 438/149, 151, 438/156, 157, 162, 166

(56) References Cited

U.S. PATENT DOCUMENTS 5,780,327 A * 7/1998 Chu et al. .................... 438/156
6,228,691 B1 * 5/2001 Doyle ......................... 438/140

OTHER PUBLICATIONS

Hergenrother, J.M., et al., "The Vertical Replacement–Gate (VRG) MOSFET with Lithography–Independent Gate Length", IEEE, Bell Laboratories, Lucent Technologies, Murray Hill, NJ 07974, pp. 3.6.1–3.6.4 (1999).

Hiroki, A., et al., "A High Performance 0.1 mm MOSFET with Asymmetric Channel Profile", IEDM 95–439, Semiconductor Research Center, Matsushita Electric Industrial Co., Ltd., pp. 17.7.1–17.7.4. (1995).

(List continued on next page.)

Primary Examiner—Long Pham
(74) Attorney, Agent, or Firm—Scully, Scott, Murphy & Presser; H. Daniel Schnurumann

(57) ABSTRACT

A method of forming a self-aligned vertical double-gate metal oxide semiconductor field effect transistor (MOSFET) device is provided that includes processing steps that are CMOS compatible. The method include the steps of growing an oxide layer on a surface of a silicon-on-insulator (SOI) substrate, said SOI substrate having a buried oxide region located between a top Si-containing layer and a bottom Si-containing layer, wherein said top and bottom Si-containing layers are of the same conductivity-type; patterning and etching gate openings in said oxide layer, said top Si-containing layer and said buried oxide region stopping on said bottom Si-containing layer of said SOI substrate; forming a gate dielectric on exposed vertical sidewalls of said gate openings and filling said gate openings with silicon; removing oxide on horizontal surfaces which interface with said Si-containing bottom layer; recrystallizing silicon interfaced to said gate dielectric and filling said gate openings with expitaxial silicon; forming a mask on said oxide layer so as cover one of the silicon filled gate openings, while leaving an adjacent silicon filled gate opening exposed; selectively implanting dopants of said first conductivity-type into said exposed silicon filled gate opening and activating the same, wherein said dopants are implanted at an ion dosage of about 1E15 cm$^{-2}$ or greater; selectively etching the exposed oxide layer and the underlying top Si-containing layer of said SOI substrate stopping on said buried oxide layer; removing said mask and implanting a graded-channel dopant profile in said previously covered silicon filled gate opening; etching any remaining oxide layer and forming spacers about said silicon filled gate openings; and saliciding any exposed silicon surfaces.

22 Claims, 3 Drawing Sheets

OTHER PUBLICATIONS

Lee, J., et al., "Super Self–Aligned Double–Gate (SSDG) MOSFETs Utilizing Oxidation Rate Difference and Selective Epitaxy", IEEE, Microsystems Technology Laboratories, Massachusetts Institute of Technology, Cambridge, MA, pp. 3.5.1–3.5.4, (1999).

Morifuji, A., et al., "An 80 nm Dual–gate CMOS with Shallow Extensions Formed after Activation Annealing and SALICIDE", IEEE, Microelectronics Engineering Laboratory, Toshiba Corporation Semiconductor Company, pp. 27.3.1–27.3.4, (1999).

Odanaka, S., et al., "Potential Design and Transport Property of 0.1–mm MOSFET with Asymmetric Channel Profile", IEEE Transactions on Electron Devices, vol. 44, No. 4, pp. 595–599, Apr. 1997.

Wong, H., et al., "Self–Aligned (Top and Bottom) Double–Gate MOSFET with a 25 nm Thick Silicon Channel" ieee, t.j. Watson Research Center, P.O. Box 218, Yorktown Heights, New York 10598, pp. 16.6.1–16.6.4, (1997).

* cited by examiner

METHOD FOR SELF-ALIGNED VERTICAL DOUBLE-GATE MOSFET

FIELD OF THE INVENTION

The present invention relates to semiconductor manufacturing, and more particularly to a method for forming a self-aligned vertical double-gate metal oxide semiconductor field effect transistor (MOSFET) wherein a silicon-on-insulator (SOI) substrate is employed in fabricating the same.

BACKGROUND OF THE INVENTION

It is well known that a dual gate or double-gate MOSFET device has several advantages over conventional single-gate MOSFET devices. Specifically, the advantages for double-gate MOSFET devices over their single-gate counterparts include: a higher transconductance, lower parasitic capacitance, and improved short-channel effects. For instance, Monte-Carlo simulation has been previously carried out on a 30 nm channel double-gate MOSFET device and has shown that the double-gate device has a very high transconductance (2300 mS/mm) and fast switching speeds (1.1 ps for nMOSFET). Moreover, improved short-channel characteristics are obtained down to 20 nm channel length with no doping needed in the channel region. Another advantage of double-gate devices over their single-gate counterparts is that improved threshold slope can be obtained.

Previous efforts of fabricating double-gate MOSFETs generally fall into one of the following three categories:

(a) Etch silicon into a pillar structure and deposit gates around it.

(b) Make a conventional single-gate MOSFET, then use either selective epitaxy or bond-and-etch-back techniques to form the second gate.

(c) Start with a thin silicon-on-insulator (SOI) film, pattern a strip and dig a tunnel across it by etching the buried oxide. Then, deposit gate electrodes in the tunnel and on top of the SOI film.

Notwithstanding which technique is employed, it is important that the gate region of the double-gate MOSFET is self-aligned. This is particularly important since failure to achieve such alignment results in excessive parasitic capacitance, and decreased drive current. Moreover, none of the prior art methods of fabricating double-gate MOSFETs decouple the gate contact implant/anneal step from the processing steps used in forming the intrinsic device; therefore, additional performance enhancement, which is typically associated with such decoupling, is not obtained from prior art methods. A further problem with conventional methods of forming double-gate MOSFET devices is that none of the conventional methods provide a satisfactory means for constructing a well-controlled vertical-asymmetrical channel-doping profile.

Examples of prior art methods of producing self-aligned double-gate MOSFETs include:

H. S. P. Wong, et al., "Self-Aligned (top and bottom) Double-Gate MOSFET with a 25 nm Thick Si Channel", IEDM Tech Dig., p. 427 (1997)—Although the Wong, et al. disclosure provides a method of forming a self-aligned double-gate MOSFET, the device provided therein is planar. Moreover, the gate is formed from in-situ doped CVD polysilicon which makes it not fully compatible with CMOS applications. Additionally, the gate length is controlled by lithography and etching which makes it difficult to achieve small gate lengths.

J. H. Lee, et al., "Super Self-Aligned Double Gate (SSDG) MOSFETS utilizing Oxidation-Rate Difference and Selective Epitaxy", IEDM Tech Dig., p.71 (1999)—This prior art reference provides self-aligned gate regions, but as is the case above, the gate length is controlled by lithography and a planar device is obtained.

J. M. Hergenrother, et al. "The Vertical Replacement-Gate (VRG) MOSFET: A 50 nm Vertical MOSFET with Lithography-Independent Gate Length", IEDM Tech. Dig., p.75 (1999)—This reference provides gates that are self-aligned and vertical. Moreover, this reference determines it gate length by film thickness rather than lithography. Despite these advantages, the Hergenrother, et al. reference uses in-situ doped polysilicon deposition which makes its compatibility with CMOS processes in question.

In view of the drawbacks mentioned hereinabove with prior art methods for fabricating double-gate MOSFET devices, it would be beneficial if a new method was developed that is relatively simple, yet effective in fabricating double-gate devices which is capable of forming self-aligned gates and a well-controlled vertical asymmetrical channel-doping profile, while decoupling the gate contact implant/anneal from the processing steps used in forming the intrinsic device.

SUMMARY OF THE INVENTION

One object of the present invention is to provide a method of forming a self-aligned vertical double-gate MOSFET device.

A further object of the present invention is to provide a method of forming a double-gate MOSFET device wherein the gate contact implant/anneal is decoupled from the processes used for forming the intrinsic device.

A yet further object of the present invention is to provide a method of forming a double-gate MOSFET device in which a well-controlled vertical-asymmetrical channel-doping profile is obtained.

An even further object of the present invention is to provide a method of forming a double-gate MOSFET device in which a SOI substrate is employed instead of a conventional bulk Si-containing substrate.

These and other objects and advantages are achieved by employing the inventive method which includes the steps of:

(a) growing an oxide layer on a surface of a silicon-on-insulator (SOI) substrate, said SOI substrate having a buried oxide region located between a top Si-containing layer and a bottom Si-containing layer, wherein said top and bottom Si-containing layers are of the same conductivity-type;

(b) patterning and etching gate openings in said oxide layer, said top Si-containing layer and said buried oxide region stopping on said bottom Si-containing layer of said SOI substrate;

(c) forming a gate dielectric on exposed vertical sidewalls of said gate openings and filling said gate openings with silicon;

(d) removing oxide on horizontal surfaces which interface with said Si-containing bottom layer;

(e) recrystallizing silicon interfaced to said gate dielectric and filling said gate openings with expitaxial silicon;

(f) forming a mask on said oxide layer so as cover one of the silicon filled gate openings, while leaving an adjacent silicon filled gate opening exposed;

(g) selectively implanting dopants of said first conductivity-type into said exposed silicon filled gate opening and activating the same, wherein said dopants are implanted at an ion dosage of about 1E15 cm$^{-2}$ or greater;

(h) selectively etching the exposed oxide layer and the underlying top Si-containing layer of said SOI substrate stopping on said buried oxide layer;

(i) removing said mask and implanting a graded-channel dopant profile in said previously covered silicon filled gate opening;

(j) etching any remaining oxide layer and forming spacers about said silicon filled gate openings; and (k) saliciding any exposed silicon surfaces.

The inventive method described above provides the following advantages:

(1) All gate and drain anneals may be optimized for highest possible activation. The gate and drain anneals are done prior to intrinsic implants.

(2) Since the device is vertical, the source/drain implants do not rely on lateral diffusion in order to achieve overlap with the gate. Therefore, the source and drain will have lower resistance for a given junction depth as compared to standard laterally diffused source/drain extensions.

(3) Moreover, the vertical design allows for optimized channel implants that is vertically graded with larger concentrations present near the source. This lateral-channel asymmetry is known to provide a performance enhancement relative to conventional symmetrical profiles. In standard planar CMOS processes, achieving lateral asymmetry is very difficult since multiple spatial orientations of device are present in any chip design. Furthermore, since planar devices rely on lateral diffusion of dopants to form profiles located specifically near the source and drain regions such lateral asymmetry is inherently harder to control. This feature is additive to other details discussed herein.

(4) All processing steps described herein are of standard, and well known nature. Therefore, the inventive method is CMOS compatible with pFET processing accomplished through the usual complementary steps.

(5) Gate lengths are controlled by the thin film SOI construction rather than by lithography and etching. Such processes are capable of achieving smaller dimensions with better control.

DETAILED DESCRIPTION OF THE INVENTION

Figure 1:
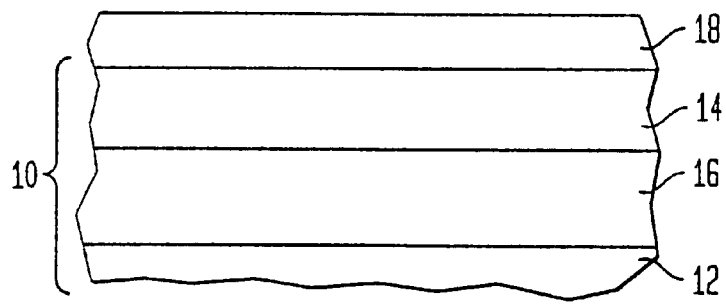
FIGS. 1–7 are cross-sectional views of the inventive double-gate MOSFET device through various processing steps of the present invention.

The present invention, which provides a method of fabricating a self-aligned vertical double-gate MOSFET device, will now be described in greater detail by referring to the drawings that accompany the present application. It is noted that in the accompanying drawings, like and corresponding elements are referred to by like reference numerals.

In accordance with the present invention, the inventive process begins by growing oxide layer 18 on a surface of silicon-on-insulator (SOI) substrate 10; See FIG. 1. The SOI substrate employed in the present invention includes buried oxide region 16 which is located between a top Si-containing layer 14 and a bottom Si-containing layer 12. The top Si-containing layer of the SOI substrate employed in the present invention is the active area of the substrate wherein devices are typically formed. This top Si-containing layer typically has a thickness of from about 20 to about 150, preferably about 30 to about 80, nm. Buried oxide region 16 of SOI substrate 10 which serves as an insulating layer between the semiconducting layers, i.e., Si-containing layers 12 and 14, has a thickness of from about 100 to about 150 nm.

The SOI substrate employed in the present invention is fabricated utilizing conventional processing techniques well known to those skilled in the art. For example, SOI substrate 10 can be made by bonding or by a conventional SIMOX (separation by implantation of oxygen) process.

Prior to forming the oxide layer on SOI substrate 10, the Si-containing layers, i.e., layers 12 and 14, are subjected to conventional ion implantation and activation anneal processes which are capable of doping each of the Si-containing layers of the substrate with either an n-type or p-type dopant. In a preferred embodiment of the present invention, an n-type dopant is present in Si-containing layers 12 and 14. It is noted that in the present invention, this ion implantation and activating annealing results in the formation of Si-containing layers in the SOI substrate that are of the same conductivity-type. Typically, the ion implantation conducted at this point of the present invention is a high dose ion implantation process wherein the dopant dose is on the order of about 1E15 cm$^{-2}$ or above. Insofar as the activation annealing step is concerned, typically a rapid high-temperature anneal (on the order of about 950° C. or above; duration about 10 seconds or less) is employed in the present invention so as to optimize activation of the implanted dopants. It emphasized that the remaining processing steps of the present invention are decoupled from this step of the present invention.

Next, oxide layer 18 is thermally grown on top of Si-containing layer 14 using any well-known thermal growing technique such as oxidation. In accordance with the present invention, this thermally grown oxide layer is a thin layer whose thickness is from about 100 to about 150 nm.

Figure 2:
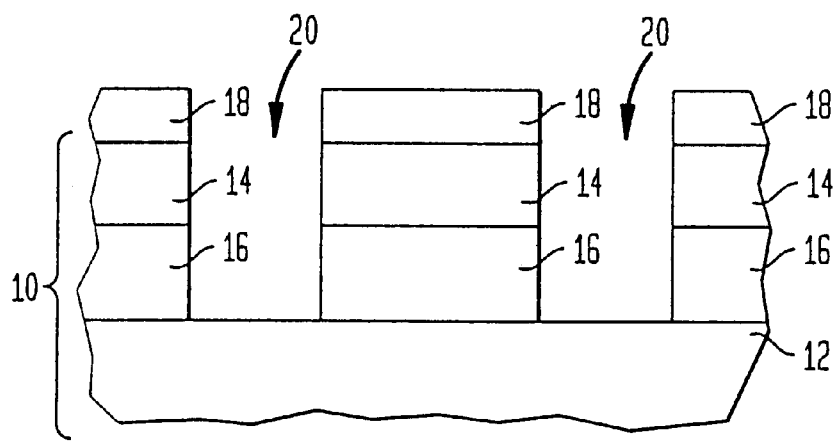

Next, the structure shown in FIG. 1 is subjected to a selective patterning process and thereafter gate openings 20 are etched through oxide layer 18, top Si-containing layer 14 and buried oxide region 16 stopping on bottom Si-containing layer 12 of SOI substrate 10, See FIG. 2. Specifically, the gate openings are formed in the structure of FIG. 1 by first applying a photoresist (not shown) to oxide layer 18. The photoresist is then subjected to a conventional lithography process including patterned wise-exposure to radiation and developing the pattern. The pattern is then transferred into the structure of FIG. 1 by removing exposed portions of layers 18, 14 and 16 stopping on layer 12 utilizing a conventional etching process such as reactive-ion etching (RIE), ion-beam etching (IBE) or plasma-etching.

After forming the gate openings in the structure, gate dielectric 22 is grown along all exposed Si surfaces present in the gate openings. Specifically, the gate dielectric is formed utilizing any conventional thermal growing process and it may be comprised of any conventional gate dielectric material such as an oxide. Any available advanced gate dielectric technique may also be employed herein. Particularly, high-nitrogen content layers or oxynitrides may be also employed. Next, a thin layer of silicon (not shown), which is either amorphous silicon or polysilicon, is deposited on the gate dielectric utilizing any conventional deposition process such as chemical vapor deposition (CVD), plasma-assisted CVD, chemical solution deposition, or sputtering. This thin silicon layer typically has a thickness of from about 10 to about 15 nm.

Figure 3:
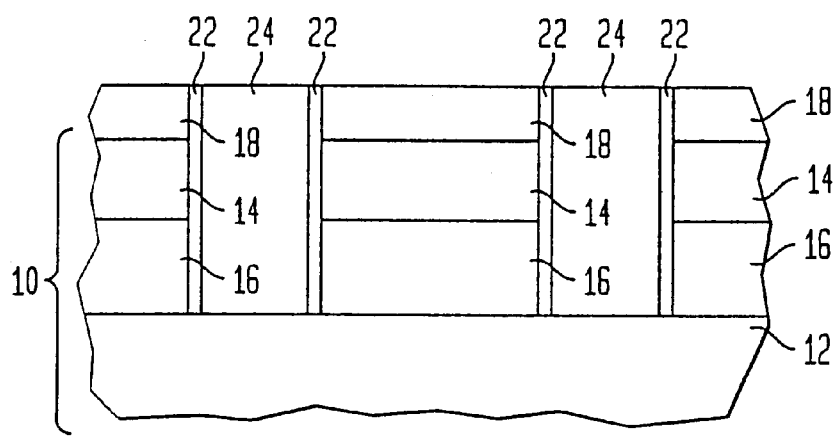

An anisotropic reactive-ion etching process is then employed to remove oxide on horizontal surfaces that interface with bottom Si-containing layer 12. An annealing step is then performed on the structure so as to recrystallize the silicon interfaced to the vertical gate dielectric layers 22 that remain after the above etching step. Gate openings 20 are then filled epitaxially with silicon 24 and then the resultant structure is subjected to a conventional planarization process such as chemical-mechanical polishing (CMP) or grinding stopping on oxide layer 18. The planarized structure having gate openings that contain vertical gate dielectric regions 22 and silicon fill 24 is shown in FIG. 3.

Figure 4:
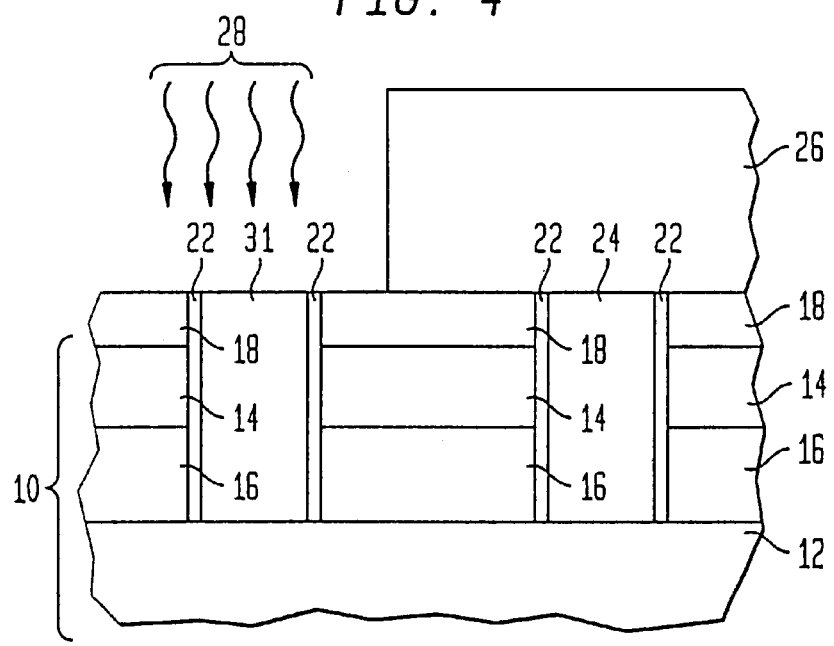

A mask 26 is then formed on oxide layer 18 so as cover one of the silicon filled gate openings, while leaving adjacent silicon filled gate openings exposed, See FIG. 4. The patterned mask shown in FIG. 4 is formed utilizing conventional lithography.

With mask 26 in place, a dopant 28 having the same conductivity as used in doping the Si-containing layers of the SOI substrate is implanted into the exposed silicon filled gate opening. The implant process used in this step of the present invention is a high-dose ion implantation process in which the dopant dose is on the order of about 1E15 cm$^{-2}$ or greater. Following doping of the exposed silicon filled gate opening, the structure is subjected to a high temperature activation annealing process. Typically, in the present invention, this activation anneal is carried out at a temperature of about 950° C. or greater for a time period of about 10 seconds or less. The resultant structure is shown in FIG. 4 wherein reference numeral 31 is used to denote the doped silicon gate region formed utilizing the above-mentioned processes. It is again noted that this activation anneal is decoupled from the process used for forming the intrinsic device.

Figure 5:
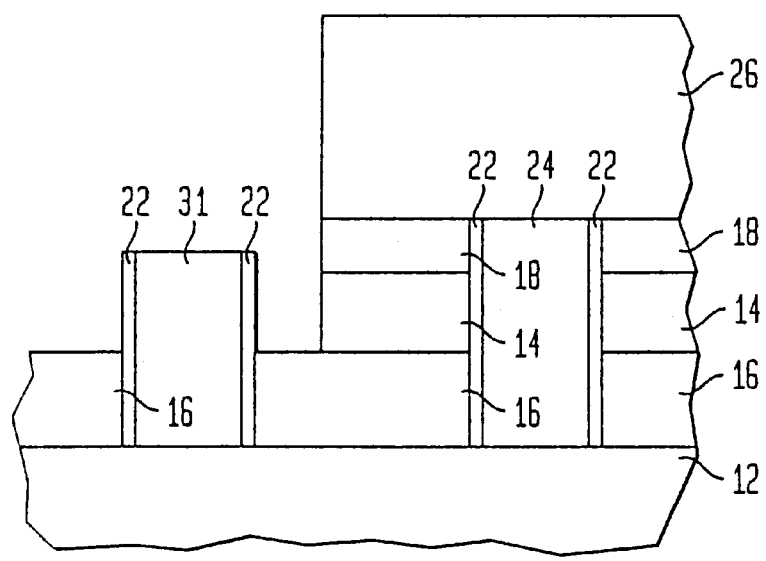

After forming doped silicon gate region 31 in the structure and with mask 26 remaining on part of the structure, the exposed portions of the structure are subjected to selective etching processes which are capable of removing exposed oxide layer 18 and Si-containing layer 14 therefrom stopping on buried oxide layer 16. These selective etching processes provide the non-planar structure shown in FIG. 5. Specifically, exposed oxide layer 18 that is not protected by mask 26 is etched stopping on Si-containing layer 14 using an etching process that has a high selective for oxide as compared to silicon. This etching step may include a reactive-ion etch or any other like anisotropic etching process. Next, exposed portions of Si-containing layer 14 are etched stopping on buried oxide layer 16 utilizing an etching process that has a high selectivity for removing silicon as compared to oxide. One example of such an etching process that has a high selectivity for removing silicon as compared to oxide is a standard poly-gate reactive-ion etch (RIE).

Figure 6:
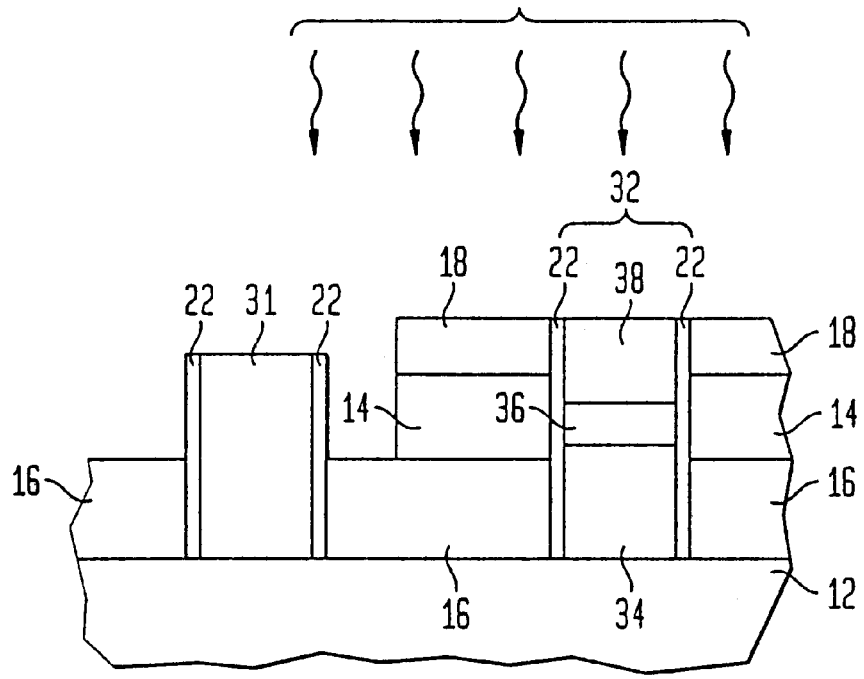

After conducting the above selective etching processes, which serve to expose the previously doped gate region, mask 26 is stripped from the structure utilizing a conventional stripping process that is well known to those skilled in the art. Next, and as shown in FIG. 6, a graded-channel dopant profile is formed in the previously covered silicon filled opening by conducting selective ion implantations which is capable of forming a graded-channel dopant profile in the previously covered silicon filled region.

Specifically, the graded-channel dopant profile 32 is formed in the previously covered silicon filled gate opening by first ion implanting a dopant of said first conductivity-type 34 into the previously covered silicon filled gate opening. After the first conductivity-type dopant is ion implanted, a second dopant of a second conductivitytype 36 that is different from the first is ion implanted and thereafter, a third dopant of the first conductivity-type 38 is ion implanted. The depth of each implant is determined by the ion dosage and energy of each dopant used in forming the graded-channel dopant profile. These values can be arbitrarily chosen thus, there is no need to indicate those values herein. Following the above ion implantations, the structure is subjected to a rapid-thermal activation anneal in which the annealing temperature is about 950° C. or above and the duration is 10 seconds or less. The structure that is formed from the above ion implantations and anneal is shown in FIG. 6.

Following formation of the graded-channel profile in one of the silicon filled gate openings of the structure, any remaining oxide layer, i.e., oxide layer 18, is removed from the structure utilizing the same or different selective oxide etching process as previously described stopping on Si-containing layer 14.

Figure 7:
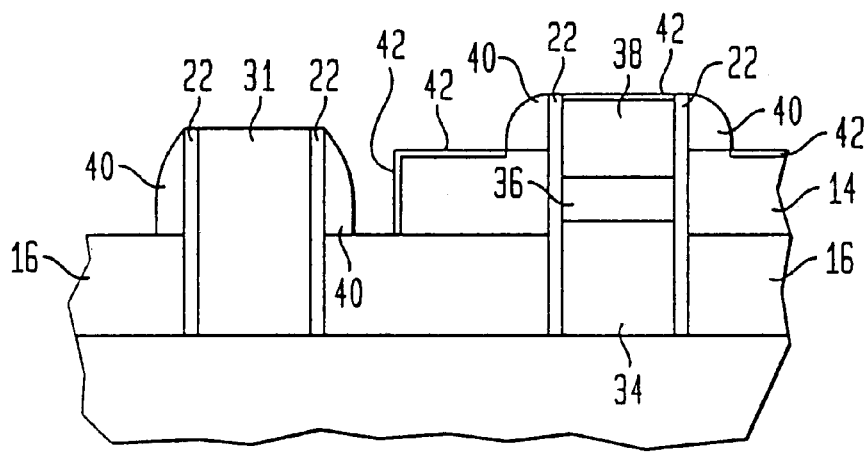

Spacers 40 are then formed on the structure utilizing a conventional deposition process (i.e., CVD) and etching (i.e., RIE). Specifically, spacers 40 which are comprised of an insulating material such as $Si_3N_4$ are formed so as to abut the doped gate regions. Following the formation of the spacers in the structure, any exposed silicon is subjected to a conventional salicidation process, which is capable of forming salicide regions 42 therein. The double-gate MOSFET structure that is obtained after conducting the above processing steps of the present invention is shown in FIG. 7.

In addition to forming a double-gate MOSFET device, the inventive method results in the following advantages:

(1) All gate and drain anneals may be optimized for highest possible activation. The gate and drain anneals are done prior to intrinsic implants.

(2) Since the device is vertical, the source/drain implants do not rely on lateral diffusion in order to achieve overlap with the gate. Therefore, the source and drain will have lower resistance for a given junction depth as compared to standard laterally diffused source/drain extensions.

(3) Moreover, the vertical design allows for optimized channel implants that is vertically graded with larger concentrations present near the source. This lateral-channel asymmetry is known to provide a performance enhancement relative to conventional symmetrical profiles. In standard planar CMOS processes, achieving lateral asymmetry is very difficult since multiple spatial orientations of device are present in any chip design. Furthermore, since planar devices rely on lateral diffusion of dopants to form profiles located specifically near the source and drain regions such lateral asymmetry is inherently harder to control. This feature is additive to other details discussed herein.

(4) All processing steps described herein are of standard, and well known nature. Therefore, the inventive method is CMOS compatible with pFET processing accomplished through the usual complementary steps. In comparison, much of the prior art employs in-situ doped gates and therefore is not CMOS compatible without using a buried channel pFET device, which is unacceptable for short-channel structures. As such, in the prior art, either an NFET or a pFET could be made, but not both.

(5) Gate lengths are controlled by the thin film SOI construction rather than by lithography and etching. Such processes are capable of achieving smaller dimensions with better control.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a self-aligned vertical double gate MOSFET device comprising the steps of:
   (a) growing an oxide layer on a surface of a silicon-on-insulator (SOI) substrate, said SOI substrate having a buried oxide region located between a top Si-containing layer and a bottom Si-containing layer, wherein said top and bottom Si-containing layers are of the same conductivity-type;
   (b) patterning and etching gate openings in said oxide layer, said top Si-containing layer and said buried oxide region stopping on said bottom Si-containing layer of said SOI substrate;
   (c) forming a gate dielectric on exposed vertical sidewalls of said gate openings and filling said gate openings with silicon;
   (d) removing oxide on horizontal surfaces which interface with said Si-containing bottom layer;
   (e) recrystallizing silicon interfaced to said gate dielectric and filling said gate openings with expitaxial silicon;
   (f) forming a mask on said oxide layer so as cover one of the silicon filled gate openings, while leaving an adjacent silicon filled gate opening exposed;
   (g) selectively implanting dopants of said first conductivity-type into said exposed silicon filled gate opening and activating the same, wherein said dopants are implanted at an ion dosage of about 1E15 cm$^{-2}$ or greater;
   (h) selectively etching the exposed oxide layer and the underlying top Si-containing layer of said SOI substrate stopping on said buried oxide layer;
   (i) removing said mask and implanting a graded-channel dopant profile in said previously covered silicon filled gate opening;
   (j) etching any remaining oxide layer and forming spacers about said silicon filled gate openings; and
   (k) saliciding any exposed silicon surfaces.

2. The method of claim 1 wherein said SOI substrate is formed by bonding or by separation by ion implantation.

3. The method of claim 1 wherein said top and bottom Si-containing layers of said SOI substrate are h-type doped.

4. The method of claim 1 wherein said top and bottom Si-containing layers of said SOI substrate are doped by ion implantation and annealing.

5. The method of claim 4 wherein said ion implantation is carried out at an ion dosage of about 1E15 cm$^{-2}$ or greater.

6. The method of claim 4 wherein said annealing is carried out at a temperature of about 950° C. or greater for a time period of about 10 seconds or less.

7. The method of claim 1 wherein said oxide layer is grown by a thermal growing process.

8. The method of claim 1 wherein said oxide layer has a thickness of from about 100 to about 150 nm.

9. The method of claim 1 wherein said selective patterning process includes lithography.

10. The method of claim 1 wherein said etching performed in step (b) is by reactive-ion etching (RIE), ion-beam etching or plasma etching.

11. The method of claim 1 wherein said gate dielectric is formed by a thermal growing process.

12. The method of claim 1 wherein said gate dielectric is an oxide or oxynitride.

13. The method of claim 1 wherein said silicon employed in step (c) is amorphous or polysilicon.

14. The method of claim 1 wherein said mask is formed by conventional deposition and lithography.

15. The method of claim 1 wherein said dopants employed in step (g) are n-type dopants.

16. The method of claim 1 wherein said implanting employed in step (g) is carried out using a high ion dosage on the order of 1E15 cm$^{-2}$ or above.

17. The method of claim 1 wherein said dopants of step (g) are annealed at a temperature of about 950° C. or greater for 10 seconds or less.

18. The method of claim 1 wherein step (h) includes an anisotropic etching process which is capable of removing said oxide layer and a reactive-ion etching process which is capable of removing said Si-containing layer.

19. The method of claim 1 wherein said graded-channel profile includes a bottom n+ region, a middle p-region and a top n+ region.

20. The method of claim 1 wherein said graded-channel profile is formed by ion implantation and annealing.

21. The method of claim 1 wherein said spacers are formed by deposition and etching.

22. The method of claim 1 wherein said spacers are composed of an insulating material.

* * * * *